United States Patent [19]

Langner et al.

[11] Patent Number: 5,481,164

[45] Date of Patent: Jan. 2, 1996

[54] VARIABLE AXIS STIGMATOR

[75] Inventors: Guenther O. Langner, Fultonville; Paul F. Petric, Brewster, both of N.Y.

[73] Assignee: International Business Machines Corporation, Armonk, N.Y.

[21] Appl. No.: 296,138

[22] Filed: Aug. 26, 1994

Related U.S. Application Data

[63] Continuation of Ser. No. 915,798, Jul. 16, 1992, Pat. No. 5,389,858.

[51] Int. Cl.$^6$ .............................. G09G 1/04; G21K 1/08; H01J 3/14

[52] U.S. Cl. .................................. 315/370; 250/396 ML; 250/398

[58] Field of Search ............................. 315/10, 11.5, 370, 315/384; 250/311, 397–398, 396 ML

[56] References Cited

U.S. PATENT DOCUMENTS

| | | | |
|---|---|---|---|
| 3,152,238 | 10/1964 | Anderson | 250/396 R |
| 3,597,609 | 8/1971 | Anger et all. | 250/307 |
| 4,397,230 | 4/1983 | Bouwhuis et al. | 250/311 |
| 4,788,425 | 11/1988 | Kobayashi | 250/311 |
| 4,791,295 | 12/1988 | Yamada | 250/311 |
| 4,902,940 | 2/1990 | Herbert | 315/382 |
| 4,962,309 | 10/1990 | White, III et al. | 250/396 R |
| 4,967,380 | 10/1990 | Szajnowski | 250/397 |
| 5,389,858 | 2/1995 | Langner et al. | 315/370 |

Primary Examiner—Gregory C. Issing
Attorney, Agent, or Firm—Whitham, Curtis, Whitham & McGinn; Charles W. Peterson, Jr.

[57] ABSTRACT

The magnetic axis of a stigmation yoke is varied from the mechanical axis of the stigmation yoke by differentially driving pairs of coils in a quadrupole configuration with currents which differ from a nominal stigmation current by approximately equal amounts, applied in opposite senses. Set-up procedures for electron beam deflection systems, such as in e-beam tools, are automated by emulating manual procedures in combination with electric alteration of the magnetic axis of the stigmator yoke. Stigmation errors can also be collected under automated set-up procedure control to allow dynamic correction of astigmatism in electron beam deflection system. Electrically variability of the magnetic axis of the stigmator yoke also allows the placement of the stigmator yoke at a position in the electron optical column other than prior to deflection stages as well as improved freedom from positional and aberrational errors.

14 Claims, 4 Drawing Sheets

| COIL | 112 | 114 | 116 | 118 |
|---|---|---|---|---|
| STIG-MATION 45° | | | | |
| SHIFT IN X | $I_S$ | $I_S$ | $I_S\left(2\frac{X_0}{R}-1\right)$ | $-I_S\left(1+\frac{2X_0}{R}\right)$ |
| SHIFT IN Y | $I_S\left(1+\frac{2Y_0}{R}\right)$ | $I_S\left(1-\frac{2Y_0}{R}\right)$ | $-I_S$ | $-I_S$ |
| STIGMATION 135° | | | | |
| SHIFT IN X | $-I_S$ | $-I_S$ | $I_S\left(1-\frac{2X_0}{R}\right)$ | $I_S\left(1+\frac{2X_0}{R}\right)$ |
| SHIFT IN Y | $I_S\left(1-\frac{2Y_0}{R}\right)$ | $I_S\left(1+\frac{2Y_0}{R}\right)$ | $I_S$ | $I_S$ |
| COIL | 122 | 124 | 126 | 128 |
| STIG-MATION 0° | | | | |
| SHIFT IN X | $I_S\left(1+\frac{\sqrt{2}X_0}{R}\right)$ | $I_S\left(1-\frac{\sqrt{2}X_0}{R}\right)$ | $I_S\left(\frac{\sqrt{2}X_0}{R}-1\right)$ | $-I_S\left(1+\frac{\sqrt{2}X_0}{R}\right)$ |
| SHIFT IN Y | $I_S\left(1+\frac{\sqrt{2}Y_0}{R}\right)$ | $I_S\left(1-\frac{\sqrt{2}Y_0}{R}\right)$ | $-I_S\left(1+\frac{\sqrt{2}Y_0}{R}\right)$ | $I_S\left(1-\frac{\sqrt{2}Y_0}{R}\right)$ |
| STIGMATION 90° | | | | |
| SHIFT IN X | $I_S\left(\frac{\sqrt{2}X_0}{R}-1\right)$ | $-I_S\left(1+\frac{\sqrt{2}X_0}{R}\right)$ | $I_S\left(1-\frac{\sqrt{2}X_0}{R}\right)$ | $I_S\left(1+\frac{\sqrt{2}X_0}{R}\right)$ |
| SHIFT IN Y | $-I_S\left(1+\frac{\sqrt{2}Y_0}{R}\right)$ | $-I_S\left(1+\frac{\sqrt{2}Y_0}{R}\right)$ | $I_S\left(1+\frac{\sqrt{2}Y_0}{R}\right)$ | $I_S\left(1-\frac{\sqrt{2}Y_0}{R}\right)$ |

VARIABLE AXIS STIGMATOR

This application is a continuation of Ser. No. 915,798, (now U.S. Pat. No. 5,389,858) filed Jul. 16, 1992.

BACKGROUND OF THE INVENTION

1. Field of the Invention

The present invention generally relates to electron beam deflection systems and, more particularly, to arrangements for reduction of aberrations therein.

2. Description of the Prior Art

Electron beam deflection systems are known in many types of devices including cathode ray tubes used for display, as in televisions, oscilloscopes and computer displays. Electron beam deflection systems are also widely used in electron beam lithography systems, particularly for exposure of resists in the fabrication of masks for use in fabrication of integrated circuits and also direct writing for patterning of resists directly placed on substrates and other structures. As integrated circuit density has increased and pattern feature size correspondingly reduced, exposure of resists using an electron beam exposure system, sometimes referred to as an e-beam tool, in which an electron beam can be deflected over a surface with high speed and accuracy under computer control, has become highly advantageous and the exposure methodology of choice.

Electron beam deflection system typically operate to deflect the electrons of the beam by subjecting them to either an electrostatic or a magnetic field or both over a finite distance along the electron path through the deflection system. These fields achieve a change of velocity of the electrons in a direction normal to the undeflected path of the electron beam. Also, the extent of structure in the direction of the electron-optical axis of the system must also often be limited in order to perform different manipulations of the electron beam at different locations along the electron beam column. The magnetic or electrical fields which are imposed on the electron beam are designed to minimize errors at the target. However, a theoretically ideal geometry for an electron beam lithography system cannot be achieved in practice since any limitation of the extent of magnetic and electrical field generating structure causes fringe fields and degrades system performance from the ideal. Further, some imperfections arise from the construction of field producing structure regardless of the design and the actual location of the axis of such structure cannot be accurately determined other than through calibration and adjustment. A number of aberrations of the spot occurring over the deflection region are susceptible to correction using signals which are a function of the position coordinates where the beam is intended to land on the target. These types of correction are referred to as dynamic corrections. Some types of dynamic correction require specific magnetic or electric field producing structures.

Specifically, when the electron beam is deflected, the plane of best focus becomes curved and astigmatism is introduced. Field curvature causes changes in the size and current density profile across a projected pattern or spot. Astigmatism alters or distorts the cross-sectional shape of the beam as it impinges on the target.

Field curvature can be corrected by the use of a projection lens which alters the final focus of the beam at a point near a target. In a magnetic system, focus correction is generally done by means of a small coil within the projection lens. This also applies to electric fields. Magnetic fields are, however, more widely used because of their lesser chromatic aberrations and because the field generating elements can be placed outside the vacuum vessel; acting through the non-magnetic walls of the vessel. The examples in the following discussion therefore refer to magnetic fields and the associated field generating arrangements. Next to field curvature, astigmatism can also be corrected, to a degree, by subjecting the electron beam to a quadrupole magnetic field. In high precision e-beam tools and cathode ray tubes, correction of deflection is also normally applied by applying a dynamic correction based on the exposure spot address. specifically, for e-beam tools, a specific error is found for each of a plurality of locations on a target corresponding to particular deflection within a field of view of the deflection system and a specific correction value stored, typically in digital form in a look-up table. In use, correction values are retrieved from storage at each location of the beam and a correction derived by interpolation. To date, this has generally provided a satisfactory degree of correction of deflection. Dynamic focus correction has also been applied in the same fashion to correct for field curvature in high precision e-beam tools.

However, at higher component densities in integrated circuits, the tolerance for distortion and aberration becomes very much reduced. For pattern design rules having a particular minimum feature size, often referred to as a regime, the tolerance for geometrical errors of position and distortion of the electron beam are usually several orders of magnitude smaller. These errors can originate from several sources and the total cumulative allowable error is commonly referred to as an error budget. For example, in a regime having a minimum feature size of a fraction (e.g. about one-quarter) of a micron, the total error budget might be on the order of a few tens of nanometers.

Keeping the geometry of an electron beam deflection within this error budget is difficult. A particular complicating factor derives from the reciprocal effects in regard to deflection and astigmatism. Specifically, while astigmatism can be adequately corrected when the electron beam passes along the axis of symmetry of the quadrupole field, usually produced by electromagnets formed as four (or eight) coils and referred to as a stigmator, correction of astigmatism under an effectively asymmetrical magnetic field, as occurs when the axis of the electron beam varies from the axis of the stigmator, causes deflection of the beam. While this correction could be approximated by the dynamic correction of deflection, discussed above. Only approximate correction is possible for the simple reason that, if the electron beam axis varies with deflection, the alteration of deflection to compensate for positional error at a particular degree of deflection will result in overcorrection of the total deflection. Such approximate correction is not adequate to achieve the precision currently required to produce integrated circuits at the integration densities otherwise possible at the present state of the art.

Astigmatism requires correction by magnitude and azimuth. A single quadrupole, consisting of four coils, would therefore require rotation to mechanically correct for angular orientation (e.g. azimuth). This cannot be done with the speed required for dynamic correction. Two quadrupoles, comprising four coils each, are therefore arranged rotated by 45° with respect to each other, preferably in the same plane. By selecting the magnitude, sign and ratio of the two exciting currents in the two quadrupoles forming the stigmator, magnitude and angular direction (azimuth) of the resulting quadrupole field can be controlled electrically.

In the prior art, only static correction of alignment of the stigmator coils and the electron beam axis could be done. This static correction required difficult, complex and extremely precise mechanical adjustment of the stigmator coils within the e-beam tool. Perhaps more importantly, the requirement that the stigmation coils be coaxial with the electron beam limited the locations the electron beam column where the stigmator could be placed. In contrast with the correction of field curvature which can be done close to the target and after deflection of the beam, the requirement for coaxial mutual positioning of the stigmator yoke and the electron beam has required placement of astigmatism correction in advance of all deflection stages in the electron optical column.

As further background, it is the practice when making mechanical adjustments of the positioning of the stigmation coils, to alter the current applied to the coils for correction of astigmatism and to observe any change in beam position at the target. This procedure essentially over- or under-corrects the astigmatism. However, since the deflection which will be caused is a function of both the astigmatism correction and the variance from coaxial positioning of the electron beam and the stigmator, the nature and magnitude of the error can be determined as a function of the resulting deflection.

Additionally, due to the precision required from the e-beam tool, it is customary to recalibrate the tool at frequent intervals of use. Since such recalibration involves non-productive "down-time" of expensive apparatus. it is economically desirable to carry out recalibration as rapidly as possible. Accordingly, some of the recalibration procedures have been automated under computer control, such as in the development of error data for dynamic correction of deflection, as discussed above. However, at the present state of the art, no technique for automation of adjustment of coaxial positioning of the stigmator and the electron beam has been available since the mechanical precision required is beyond the capability of servo systems.

At the present state of the art, it is known to shift the electron-optical axis of round (rotationally symmetric-magnetic lenses by electrical means, specifically by superimposing a deflection field generated by a deflection yoke meeting certain mathematical conditions regarding the shape of the field distribution along the axis. A Variable Axis Lens and its advanced development, the Variable Axis Immersion Lens (VAIL) are described in U.S. Pat. Nos. 4,544,846 and 4,859,856, assigned to the assignee of the present invention, and are used in practice.

SUMMARY OF THE INVENTION

It is therefore an object of the present invention to provide a variable axis stigmator arrangement.

It is another object of the invention to provide electrically controllable variation of the axis of an electron beam stigmator.

It is a further object of the invention to provide dynamic correction of stigmation axis.

It is yet another object of the invention to provide automation of stigmator axis position adjustment.

In order to accomplish these and other objects of the invention, a method of altering the axis of a quadrupole field generating element configuration having field elements thereof arranged in pairs is provided including the steps of increasing the value of an electrical input parameter for one field element of a pair of field elements by a predetermined value, and decreasing the value of an electrical input parameter for another field element of a pair of field elements by said predetermined value.

In accordance with another aspect of the invention, a quadrupole magnet, such as a stigmator yoke, is provided having at least four coils arranged in pairs in a quadrupole configuration wherein at least the coils of at least one said pair of coils are individually electrically accessible.

In accordance with a further aspect of the invention, an arrangement for alteration of the magnetic axis of a quadrupole magnet is provided including a yoke having at least four coils arranged in pairs in a quadrupole configuration wherein at least the coils of at least one said pair of coils are individually electrically accessible.

In accordance with yet another aspect of the invention, a method of shifting a magnetic axis of a yoke from the position of a mechanical axis of a quadrupole magnet having at least four coils arranged in pairs in a quadrupole configuration wherein at least the coils of at least one pair of coils are individually electrically accessible, wherein the method includes the step of individually driving said coils of said at least one pair of coils.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
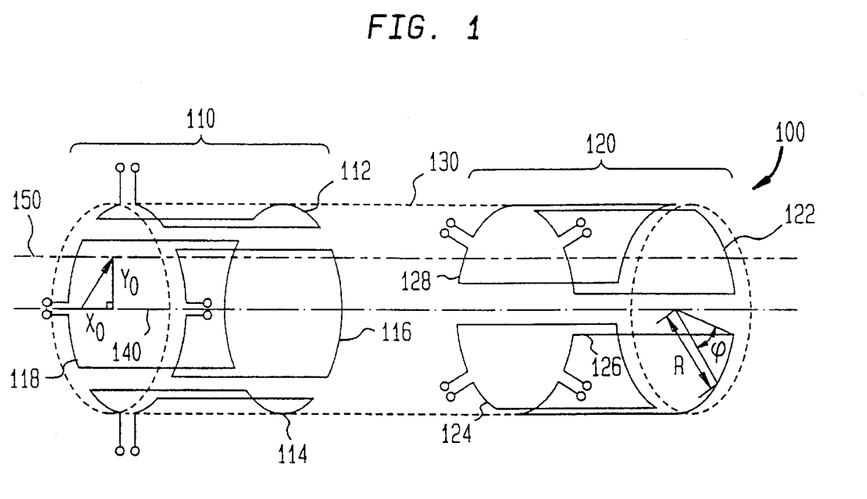
FIG. 1 is an isometric view of the basic structure of a stigmator yoke, exploded along the axis of the yoke and shown in schematic form, in accordance with the invention.
Figure 2:
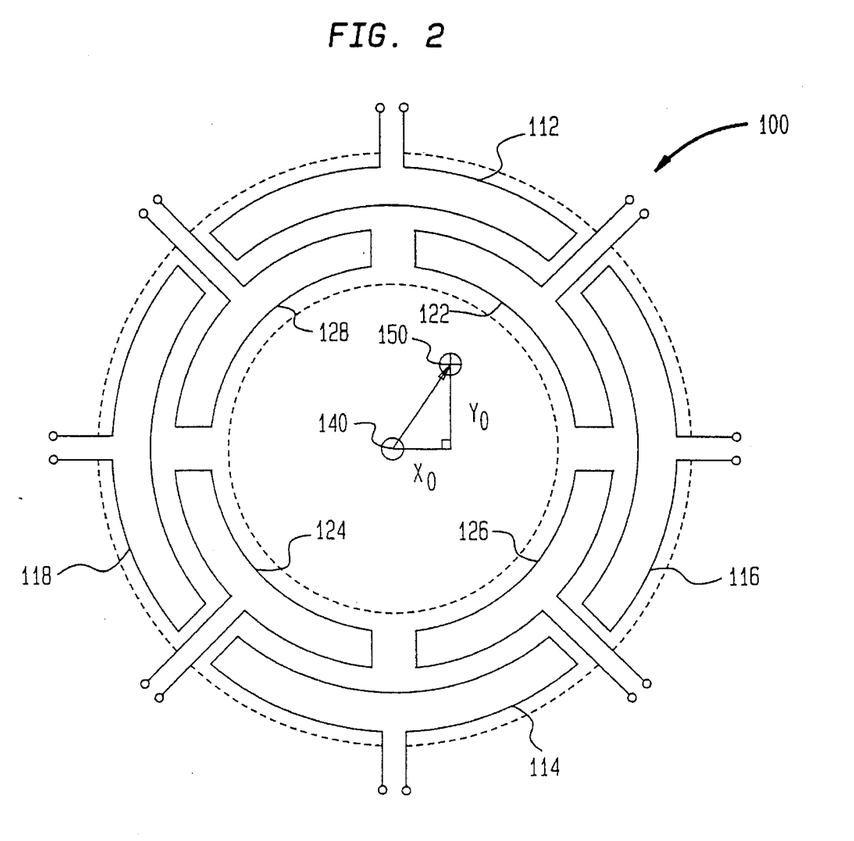
FIG. 2 is an axial perspective view of the exploded, schematically depicted structure of FIG. 1.

Referring now to the drawings, and more particularly to FIGS. 1 and 2, there is shown, in schematic and exploded form, a stigmator yoke 100 in accordance with the invention. Stigmator yoke 100 has two sections 110 and 120 which are identical but relatively rotated by 45° from each other. These quadrupole configurations are normally superimposed in the same axial position with respect to the electron beam column. The distance between the two sections 110, 120 depicted in FIG. 1 is provided merely for clarity of illustration and is not intended to necessarily indicate different axial positions of the quadrupoles. By the same token, it is to be understood that FIG. 2 should only be considered as a perspective view as to the schematic, exploded view of FIG. 1.

It should also be noted that quadrupole magnet configurations are used in numerous applications other than the correction of astigmatism in charged particle beam devices. Therefore, while the invention will be described below with reference to a charged particle beam deflection system particularly for use in high precision electron beam lithography, it is equally applicable to any quadrupole electromagnet, regardless of the intended field of use.

It is to be understood that while the invention will be described in terms of a magnetic yoke for correction of astigmatism in an electron beam deflection/projection arrangement, this correction can also be accomplished by quadrupole arrangements for producing electrical fields as well as magnetic fields. Therefore the phrase "quadrupole field generating element configuration" is to be understood as generic to structure for generating either electrical or magnetic quadrupole fields or combinations thereof. Likewise, the term "field element" is to be considered generic to a pole of the field whether constituted by a coil carrying a current to generate a magnetic field or a plate or other structure to which a potential is applied to generate an electrical field. Likewise, an "input parameter" having a value is to be considered as generic to both a current for producing a magnetic field and a potential for producing an electrical field.

By the same token, the invention is broadly directed to the non-mechanical shifting of the axis of any quadrupole field generating element configuration. Therefore, it is also to be understood that the invention is applicable to systems other than electron beam deflection systems such as quadrupoles field generating element configurations which are used as strong focussing elements in ion beam systems and other high-energy charged particle beam systems as well as other probe forming systems such as electron microscopes and lithography columns.

Astigmatism can be characterized by an amplitude (e.g. A degree of distortion such as the eccentricity of a resulting ellipse when a circular spot is distorted) and a rotation (the axis along which the distortion occurs). The angular offset between the two sections 110 and 120 allows correction of astigmatism at any rotation by adjustment of the relative current applied to the coils of the respective sections.

Each section of the stigmator yoke includes four coils (e.g. 112, 114, 116 and 118) arranged about a generally cylindrical periphery of radius R, illustrated by dashed lines 130. Each of these coils will represent a magnetic pole and the arrangement of each section is generally referred to as a quadrupole. It should be understood that this configuration differs from previously known quadrupole stigmation yokes since terminals of each of the coils 112, 114, 116, 118, 122, 124, 126 and 128 are made individually electrically accessible. In prior stigmator yokes, the coils of each section would be connected together in series with a polarity to produce a field similar to that shown in FIG. 3 and only terminals for respective sections 110 and 120 were electrically accessible.

Stigmator yoke 100 has a mechanical axis, shown by single dashed chain line 140 in FIG. 1 and ⊙ in FIG. 2, which, if the coils of each section are commonly driven and physically identical, will coincide with the axis of symmetry of the fields produced thereby. This symmetry of the magnetic field configuration and the gradients thereof cause differential acceleration of individual electrons of the beam in an amount corresponding to their positional deviation from an ideal beam path along the stigmator axis.

It has been found by the inventors that the electron-optical axis of a quadrupole magnet can be electrically shifted from the mechanical axis. The inventors have further discovered that the symmetry of the quadrupole can be preserved in sufficient degree for astigmatism correction over a relatively large portion of the cross-section of a quadrupole used as a stigmation yoke by altering the relative currents in the coils of each stigmator section. Therefore, the axis of the stigmator can be shifted electrically to coincide with the electron beam path, as illustrated, for example, by two dot chain line 150 in FIG. 1 and ⊕ in FIG. 2 which may or may not be shifted by orthogonal component distances of $x_0$ and $y_0$ from the mechanical axis of the yoke. In this regard, it is to be understood that, as a practical matter, imperfections and unavoidable mechanical differences in the windings of a manufactured yoke usually cause the axis of symmetry of the magnetic fields to depart from the mechanical axis of the yoke. A particular advantage or application of the invention is that the invention allows the center of field symmetry to be superimposed on the mechanical axis of the yoke or placed at any other position which will be centered on the charged particle beam path.

Figure 3:
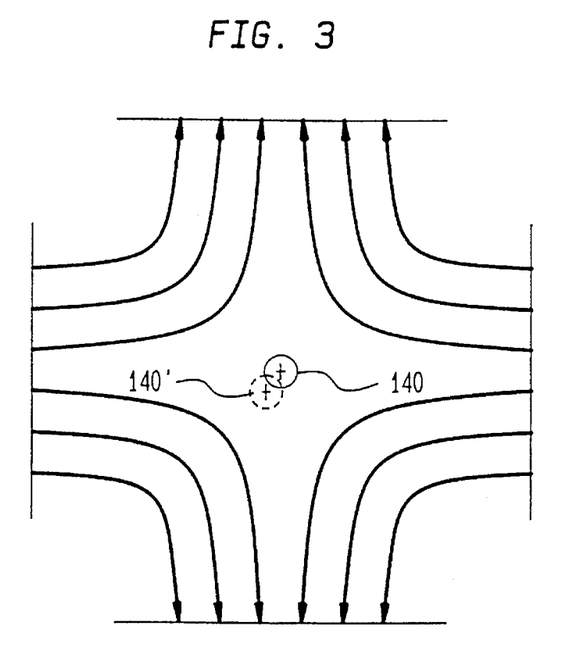
FIG. 3 depicts the fields produced by a stigmator section as axially viewed.

More specifically, referring to FIG. 3, which provides a view similar to that of FIG. 2, the magnetic field pattern produced by section 110 is shown for the condition that currents in each of coils 112, 114, 116 and 118 are precisely equal, as would be produced by the serial connection of the coils in previous arrangements and the coils precisely identical in physical conformation and precisely positioned symmetrically about the mechanical axis of the yoke. The additional, usually superimposed, magnetic field which would be produced by section 120 is omitted in the interest of clarity. In contrast, if the currents in coils 112, 114, 116 and 118 are not equal, the magnetic field pattern will be changed. For example, if current is increased in coils 112 and 116 and decreased in coils 114 and 118, a magnetic field pattern such as in FIG. 4 may result, in accordance with the invention. Although the illustrated shift of the center of field symmetry would be very much smaller, a similar deviation could be caused by physical differences between the coils or errors in the relative positions of the coils, as indicated at 140' of FIG. 3.

Figure 4:
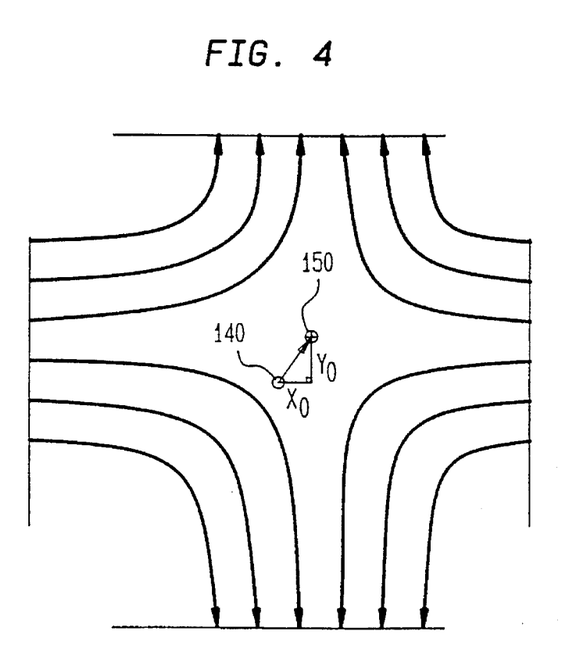
FIG. 4 depicts the fields produced by a stigmator section as axially viewed but with the axis shifted in accordance with the practice of the invention, FIG. 5 schematically shows the drive circuitry for achieving stigmator axis shift in accordance with the invention, including dynamic correction and automated calibration.

It should be noted that, in FIG. 4, substantial symmetry of the magnetic field is preserved about a point shifted from mechanical axis 140 which corresponds to an electron beam axis 150 at which astigmatism will be corrected without introducing undesirable deflection. However, the relative current in each coil must be precisely controlled to achieve a sufficient degree of symmetry to support this function.

The currents for each of the coils necessary to maintain a sufficient degree of magnetic field symmetry for effectively shifting the axis of a general quadrupole arrangement consisting of two quadrupoles rotated by 45° are derived as follows.

The distribution of the deflection field in a variable axis stigmator to bring about an axis shift is the same as that of the quadrupole. Consequently, the same coils (or electrodes, in an electrostatic stigmation arrangement) can be used for both functions.

Generally, the first order terms of the mathematical field expansion for a general quadrupole arrangement comprising two quadrupole magnets rotated 45° with respect to each other are $$\left\{ \begin{array}{c} E_x(z) \\ B_x(z) \end{array} \right\} = a_x(z) - b(z)x + c(z)y$$

$$\left\{ \begin{array}{c} E_y(z) \\ B_y(z) \end{array} \right\} = a_y(z) - b(z)y + c(z)x$$

where $B_{x,y}$ is the magnetic flux density in each of the x and y directions, where a, b, and c to the geometry os coils and the currents therein, and, in the case of an electrical field $E_{x,y}$ where a, b and c relate to electrode geometry and the voltages thereon. This can be written generally as $$a_{x,y}(z) = G(z) \cdot nI_{x,y}/R,$$

$$b(z) = f(Z) \cdot nI_b/R^2 \text{ and}$$

$$c(z) = f(z) \cdot nI_c R^2$$

where $nI_{x,y}$ denote the current in the deflector (dipole) for the fields in the x and y directions, respectively, $nI_b$ and $nI_c$ denote the currents in the two quadrupoles, respectively, times the number of turns of the coils, R denotes the distance of the coils from the axis of mechanical symmetry, and f(z) and g(z) denote functions for distributions of the respective fields along the axis, representing the geometry of the coils. Referring to FIGS. 1 and 2, the function and index b represent the quadrupole comprising coils 110, namely 112, 114, 116 and 118. The function and index c represents the quadrupole comprising coils 120, namely 122, 124, 126 and 128.

If $I_x = I_y = 0$, meaning $a_x = a_y = 0$, there is a pure quadrupole field which vanishes on the axis x=y=0. Shifting the axis to the position x=$x_0$, Y=$Y_0$ requires that $B_x = B_y = 0$ in the mathematical field expansion for a quadrupole given above. This, in turn, leads to the condition $$a_x(z) = b(z)x_0 - c(z)Y_0 \text{ and}$$

$$a_y(z) = -b(z)Y_0 - c(z)x_0.$$

Since these conditions require that g(z)=f(z) except for a scaling factor, they can, in accordance with the invention, be satisfied by using the same coils for the quadrupoles and the generators of the deflection field. Thus, substituting for a in the equations for the mathematical field expansion for a quadrupole and using the coordinates of the shifted axis, the new field expansion about the new axis is $$\left\{ \begin{array}{c} E_x \\ B_x \end{array} \right\} = -b(z)\xi - c(z)\eta;$$

$$\left\{ \begin{array}{c} E_y \\ B_y \end{array} \right\} = b(z)\eta - c(z)\xi,$$

which also characterizes a stigmator consisting of two quadrupoles with one quadrupole rotated by 45° with respect to the other to a first order of approximation for an electron beam, or more generally, a charged particle beam entering at the position x=$x_0$, Y=$Y_0$ in the coordinate system having its origin at the mechanical axis.

More explicitly, for shifting the axis of the quadrupole to any location separated by a distance R at angle ϕ with respect to the original axis of the yoke, $$a_x = 0.8 \frac{\text{Gauss cm}}{\text{amps}} f(z) \frac{nI_{1,3}}{R} \sin\phi,$$

$$a_y = 0.8 \frac{\text{Gauss cm}}{\text{amps}} f(z) \frac{nI_{2,4}}{R} \sin\phi$$

for the 45°/135° quadrupole, and $$a_x = 0.8 \frac{\text{Gauss cm}}{\text{amps}} f(z) \frac{n}{R} \sin\phi \frac{\sqrt{2}}{2} (I_{5,7} - I_{6,8}),$$

$$a_y = 0.8 \frac{\text{Gauss cm}}{\text{amps}} f(z) \frac{n}{R} \sin\phi \frac{\sqrt{2}}{2} (I_{5,7} + I_{6,8})$$

for the 0°/90° quadrupole, and $$b(z) = c(z) = 1.6 \frac{\text{Gauss cm}}{\text{amps}} f(z) \frac{n}{R^2} \sin\phi.$$

where n is equal to the number of turns of each coil of the yoke.

Figure 6:
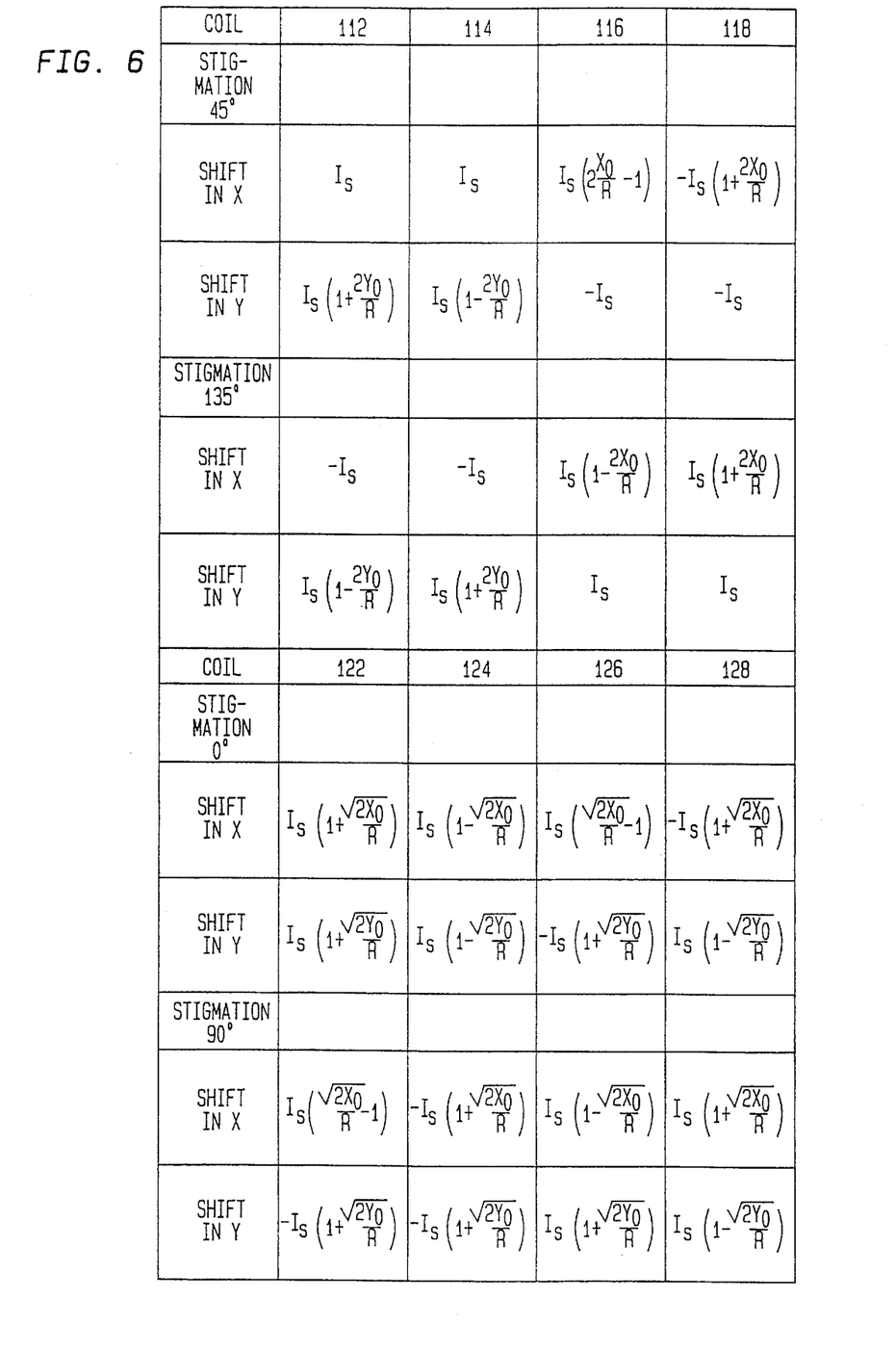
FIG. 6 is a table of stigmator coil currents which are effective to shift the axis of the stigmator in accordance with the invention.

This yields the table of currents, shown in FIG. 6, as coefficients for I, which is a reference stigmation current. This table thus provides a coefficient by which a particular reference stigmation current level must be multiplied to obtain a particular stigmator axis shift in an amount equal to the vector sum of orthogonal shift components $x_0$ and $Y_0$. It is important to note in this table that for stigmator section 110, the currents are either ±1 or ±1 ± a factor of constant form depending of the orthogonal amounts of axis shift required. For stigmator section 120, the coefficients are all positive or negative quantities including a term of constant form depending on a distance of axis shift in one of the coordinate directions, ±1. Essentially, two currents must be summed for one section (e.g. 110) and three for the other (e.g. 120).

Therefore, since it is possible to control the gain of stigmator coil drivers and to apply an adjustment to a reference current level in either the positive or negative sense, only three control signals need to be provided for the individual drivers of all eight coils. Alternatively, if such inputs are not available on the particular coil drivers used, a simple operational amplifier circuit, itself well known in the art, can be used to provide such inputs. Since changes in stigmator currents are typically small, high band width is not usually required even for dynamic correction of astigmatism made possible by the present invention.

As a practical matter, $x_0$ and $Y_0$ are unknown. However, since the axis of the stigmator can be electrically shifted by virtue of the invention, the prior technique of alignment of the axis of the stigmator can be automated and the automatic collection of dynamic correction data can be included in a single automated process in accordance with the invention, as will be discussed with reference to FIG. 5.

Figure 5:
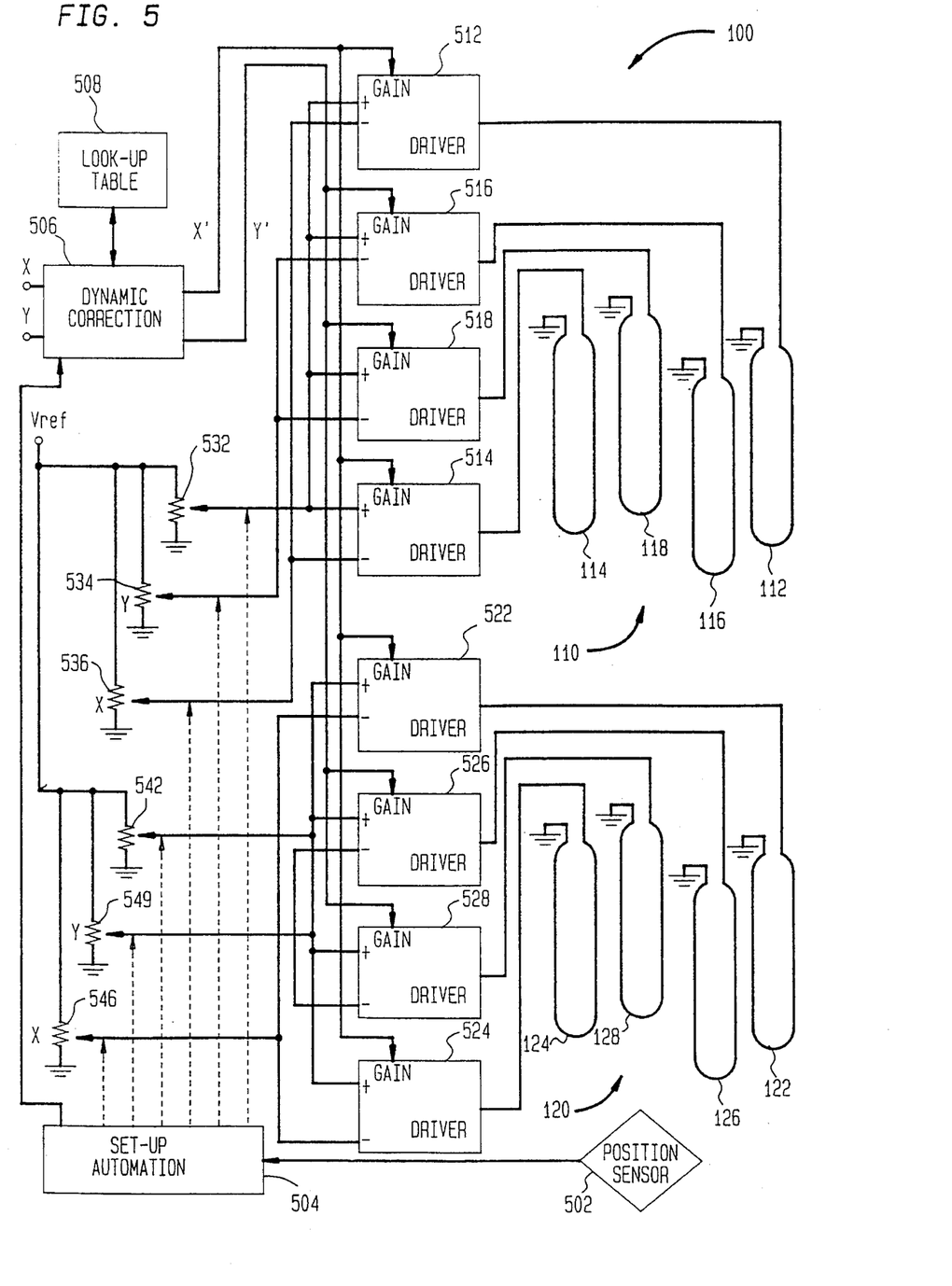

In FIG. 5, the overall preferred implementation of the invention, including the automated set-up procedure is shown. The stigmator yoke 100 including sections 110 and 120 are schematically depicted in a view similar to that of FIG. 1. The individual coils thereof 112–128 are identified with the same reference numerals as in FIG. 1. Coil drivers 512–528 are connected thereto and are identified with the same least significant digits of the reference numerals as the coils to which they are connected, in the interest of clarity. The above-mentioned reference current input is not shown and may be included in a differential amplifier input stage to the drivers in a conventional manner. Positive, negative and gain adjustment inputs of each of the coil drivers 512–528 are shown. It is also to be understood that a single input may be provided for the positive or negative correction and internal circuitry provided for applying the correction increment in the desired sense, in a manner which is also conventional in amplifier design.

For normal use, dynamic correction means 506 may be used, if desired. If used, such a dynamic correction means would function in the same manner as is conventionally done for deflection circuits. That is, the x and y inputs are used to access corrected x' and y' values from look-up table 508 which are then substituted for the input x and y values or interpolation is done between look-up table values and the interpolated values x' and y' values substituted and for x and y and output to the appropriate coil drivers. Alternatively, if dynamic correction is not required or desired, x and y values can be directly applied to the coil driver circuits. Specifically, the x or x' signal is applied to drivers 512, 514, 522 and 528. The y or y' signal is applied to drivers 516, 518, 526 and 528. Internally of the driver circuits, the x and y deflection signals are applied as a multiplier of the positive or negative correction increment signal since the correction coefficients shown in FIG. 6 are linear functions of $x_0$ and $Y_0$.

It should be noted that x and y inputs are only necessary if the electron beam axis varies with deflection. This will be the case if the stigmator yoke is placed to follow any deflection stage in the electron optical column of the electron beam deflection system. Therefore, an embodiment allowing for such inputs is preferred as being of most general application. Dynamic correction at least to the extent of scaling is also preferred since the axis offset distance will differ from that at the target. However, if the stigmator is located as the first element of the electron optical column, no x and y inputs need be applied to the drivers since the alignment of the electron optical axis of the stigmator yoke can be done with a single adjustment of the positive and negative correction increment adjustments for $x_0$ and $Y_0$ as will now be explained.

If it is only necessary to align the stigmator yoke with an electron beam axis which is not altered by deflection, the previous technique of alignment by sensing deflection as stigmation current is altered can be emulated under computer control. Specifically, by slightly altering the gain control 532 control in a predetermined manner by altering controls 532 and 542, responsive to set-up automation means 504, any resulting deflection can be detected at position sensor 502. In response to the direction of deflection sensed at 502, the x and y adjustments 534, 536, 544, 546, for each of the sections 110, 120, can be appropriately altered. This process can be repeated several times at high speed under programmed control of the set-up automation means until no deflection is observed when the coil driver gain is varied. Once this is done for a single reference position, the process can be repeated under programmed control at other locations of a target and further correction values entered in look-up table 508 to provide additional stigmator axis correction. This further correction can then be made dynamically in the same manner as dynamic deflection correction during operation of the e-beam tool.

In the above-discussed embodiment of the invention, it should be understood that the axis of each of the quadrupoles is shifted to corresponding locations and the quadrupoles need not be at the same axial position, insofar as the axis shift is concerned. It should, therefore, be understood that in an application where only one quadrupole was used, the axis could be shifted in the same manner as either of quadrupoles 110 or 120. By the same token and as a variation of the invention when the quadrupoles are at the same axial position along the charged particle beam column, it is also possible to reduce the number of drivers utilized while retaining the ability to shift the axis of the pair of quadrupoles. Since the fields produced by both quadrupoles are superimposed on each other, it is possible to obtain a net shift of axis of the yoke by shifting the axis of only one quadrupole.

In this case, the coils of either quadrupole could be connected in series and driven by a single driver while the coils of the other quadrupole would be separately driven, as described above. The net axis shift can be obtained regardless of which quadrupole axis is shifted in accordance with the invention. If the coils of quadrupole 120 are commonly driven (e.g. connected in series) with a current $I_2$, the net axis shift is obtained when coils 112–118 are driven with the following currents:

Coil 112: $I_1-(I_2x_0+I_1Y_0)/R$,

Coil 114: $-I_1-(I_2x_0+I_1Y_0)/R$,

Coil 116: $I_1+(I_1x_0-I_2Y_0)/R$,

Coil 118: $-I_1-(I_1x_0-I_2Y_0)/R$.

If the coils of quadrupole 110 are commonly driven (e.g. connected in series) with a current $I_1$, the net axis shift is obtained when coils 122–128 are driven with the following currents:

Coil 122: $-I_2+[I_2(x_0+Y_0)/R\sqrt{}/2$,

Coil 124: $-I_2-[I_2(x_0+Y_0)/R\sqrt{}/2$,

Coil 126: $I_2-[I_2(x_0+Y_0)/R\sqrt{}/2$,

Coil 128: $I_2+[I_2(x_0+Y_0)/R\sqrt{}/2$.

In this latter case, it should be noted that the currents for coils 122–128 are completely independent of $I_1$ which may yield simplification of computation for dynamic correction of astigmatism or other applications such as in the strong focussing of ion beam and other high energy beam applications noted above. To the extent that such simplification may be beneficially exploited, therefore, the orientation of coils as in quadrupole 120 is deemed preferable. Orthogonal directions of distances $x_0$ and $Y_0$ are also preferably established in accordance with that orientation.

In view of the foregoing, it is seen that the invention provides a simple technique of shifting the magnetic axis of a stigmator yoke relative to the mechanical axis thereof by electrical means. This allows the alignment to be accomplished under automated control to eliminate manual mechanical adjustments and to allow automation of the corresponding portion of the set-up procedure for an e-beam tool. Further, the ability to electrically alter the magnetic axis of the stigmator yoke provides the capacity for dynamic correction of the stigmator axis to further increase accuracy of the e-beam tool or to provide flexibility in the location of the stigmator yoke along the electron optical column, or both.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An arrangement for shifting the axis of a quadrupole field including a yoke having at least four coils arranged in pairs in a quadrupole configuration wherein at least the coils of at least one said pair of coils are individually electrically accessible, means for individually driving said coils of said at least one pair of coils including means for individually deriving current values for each coil of said at least one pair of coils in accordance with a position to which said axis is to be shifted, wherein said means for individually driving said coils of said at least one pair of coils is responsive to means for detecting deflection of a beam of charged particles in response to change of current in said at least one pair of coils.

2. An arrangement as recited in claim 1, further including means for controlling said means for individually driving said coils of said at least one pair of coils for differentially altering current in respective ones of said at least one pair of coils by approximately the same amount.

3. An arrangement as recited in claim 2, wherein said amount is approximately a linear function of one of two orthogonal components of a distance of a magnetic axis of said yoke from a mechanical axis of said yoke.

4. An arrangement as recited in claim 1, further including means for altering current in all coils of said yoke.

5. An arrangement as recited in claim 4, wherein said quadrupole field comprises an astigmatism correction arrangement for a charged particle beam deflection system.

6. An arrangement as recited in claim 4, wherein said quadrupole field comprises an astigmatism correction arrangement for an electron beam deflection system.

7. An arrangement as recited in claim 6, further including means for detecting electron beam deflection when said current in all coils of said yoke is altered by said means for altering current in all coils of said stigmator yoke.

8. A stigmation correction arrangement as recited in claim 1, wherein said means for altering current in all coils of said yoke is responsive to programmed control of set-up automation means.

9. A stigmation correction arrangement as recited in claim 8, wherein said means for individually driving said coils of said at least one pair of coils is responsive to said means for detecting electron beam deflection and said set-up automation means.

10. A stigmation correction arrangement as recited in claim 9, further including dynamic stigmation correction means.

11. A method of shifting a magnetic axis of a yoke from a mechanical axis of said yoke, said yoke having at least four coils arranged in pairs in a quadrupole configuration wherein at least the coils of at least one pair of coils are individually electrically accessible, said method comprising the steps of individually driving said coils of said at least one pair of coils, controlling said individual driving of said at least on pair of coils for differentially altering current in respective ones of said at least one pair of coils by approximately the same amount, detecting deflection of a charged particle beam which is passed through said quadrupole when current in said at least one pair of coils is altered, and deriving current values for each coil of said at least one pair of coils in accordance with a location to which said magnetic axis is to be shifted in response to said detecting step.

12. A method as recited in claim 11, further including the steps of altering current in all of said at least four coils, detecting deflection of an electron beam in response to said step of altering current in all of said at least four coils, and performing said step of individually driving said coils of said at least one pair of coils in response to said step of detecting deflection of an electron beam in response to said step of altering current in all of said at least four coils.

13. A method as recited in claim 12, including the further step of determining at least one error value in response to at least one repetition of said steps of
altering current in all of said at least four coils, and
detecting deflection of an electron beam in response to said step of altering current in all of said at least four coils.

14. A method as recited in claim 13, including the further step of performing dynamic correction of astigmatism in response to a deflection value and said at least one error value.

\* \* \* \* \*